(12) United States Patent
Orcutt (10) Patent No.: US 7,050,211 B2
(45) Date of Patent: May 23, 2006

(54) TORSIONAL HINGED MIRROR ASSEMBLY WITH CENTRAL SPINES AND PERIMETER RIDGES TO REDUCE FLEXING

(75) Inventor: John W. Orcutt, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/055,392

(22) Filed: Feb. 10, 2005

(65) Prior Publication Data

US 2005/0162724 A1  Jul. 28, 2005

Related U.S. Application Data

(63) Continuation-in-part of application No. 10/682,015, filed on Oct. 9, 2003, and a continuation-in-part of application No. 10/681,934, filed on Oct. 9, 2003, now Pat. No. 6,956,684.

(60) Provisional application No. 60/556,121, filed on Mar. 24, 2004, provisional application No. 60/424,915, filed on Nov. 8, 2002.

(51) Int. Cl.
*G02B 26/08* (2006.01)

(52) U.S. Cl. ...................... 359/224; 359/198; 359/199; 359/213

(58) Field of Classification Search ................ None
See application file for complete search history.

(56) References Cited

U.S. PATENT DOCUMENTS 5,999,303 A * 12/1999 Drake .................... 359/224

* cited by examiner

*Primary Examiner*—James Phan
(74) *Attorney, Agent, or Firm*—William B. Kempler; W. James Brady, III; Frederick J. Telecky, Jr.

(57) ABSTRACT

A torsional hinged mirror design with reduced flexing. In addition to a central spine to prevent or reduce flexing of the tips, the mirror layer also includes perimeter ridges to reduce or prevent flexing or warping of the mirror edges. To provide an even stiffer mirror with minimum weight, either or both of the hinge plate and balancing plate may also include perimeter ridges that align with the perimeter ridges of the mirror layer.

18 Claims, 7 Drawing Sheets

TORSIONAL HINGED MIRROR ASSEMBLY WITH CENTRAL SPINES AND PERIMETER RIDGES TO REDUCE FLEXING

This application claims the benefit of U.S. Provisional Application No. 60/556,121, filed on Mar. 24, 2004; and is a Continuation-In-Part of U.S. application Ser. No. 10/681,934 filed on Oct. 9, 2003, which claims benefit to Provisional Application No. 60/424,915, filed on Nov. 8, 2002; and is a Continuation-In-Part of U.S. application Ser. No. 10/682,015 filed on Oct. 9, 2003, which claims benefit to Provisional Application No. 60/424,915, filed on Nov. 8, 2002. Each of these applications is hereby incorporated herein by reference.

CROSS-REFERENCE TO RELATED APPLICATIONS

This application relates to the following co-pending and commonly assigned patent applications Ser. No. 11/054,926, filed concurrently herewith, entitled A Multilayer Torsional Hinged Mirror With A Recessed Drive/Sensing Permanent Magnet; and Ser. No. 11/066,834, filed Feb. 24, 2005, entitled A Single Piece Torsional Hinged Device With Central Spines And Perimeter Ridges To Reduce Flexing, which application are hereby incorporated herein by reference.

TECHNICAL FIELD

The present invention relates to maintaining a flat reflective surface during the operation of torsional hinged mirrors and more particularly to such torsional hinged mirrors that rotate or oscillate at high speeds.

BACKGROUND

Pivoting or oscillating torsional hinged mirrors provide very effective yet inexpensive replacements for spinning polygon shaped mirrors in printers and some types of displays. As will be appreciated by those skilled in the art, torsional hinged mirrors may be MEMS type mirrors etched from a silicon substrate using processes similar to those used in the manufacture of semiconductor devices. Earlier versions of torsional hinge mirrors for providing a raster type scan for printers and displays often operated at rotational speeds of about 3 KHz or less. Torsional hinged mirrors operating at 3 KHz or slower can be manufactured thick enough so that they do not demonstrate serious flatness problems with respect to the reflective surface. However, as the demand for higher print speeds and better resolution increased, flatness of the mirror reflective surface has now become a much more serious problem. As the mirror continuously flexes or bends back and forth during the continuous oscillations about the axis, the greatest deformation was at the tip or ends of the flexing mirror. Presently available mirrors have substantially reduced this problem by the use of a hinge plate that includes a center spine that extends along the long axis of the elliptical shaped mirror to each of the tips or ends of the mirror. Unfortunately, with greater rotational speeds and thinner and smaller mirrors, new flexing modes around the edges now affect the flatness of the mirror during operation.

Figures 11, 12A, 12B:
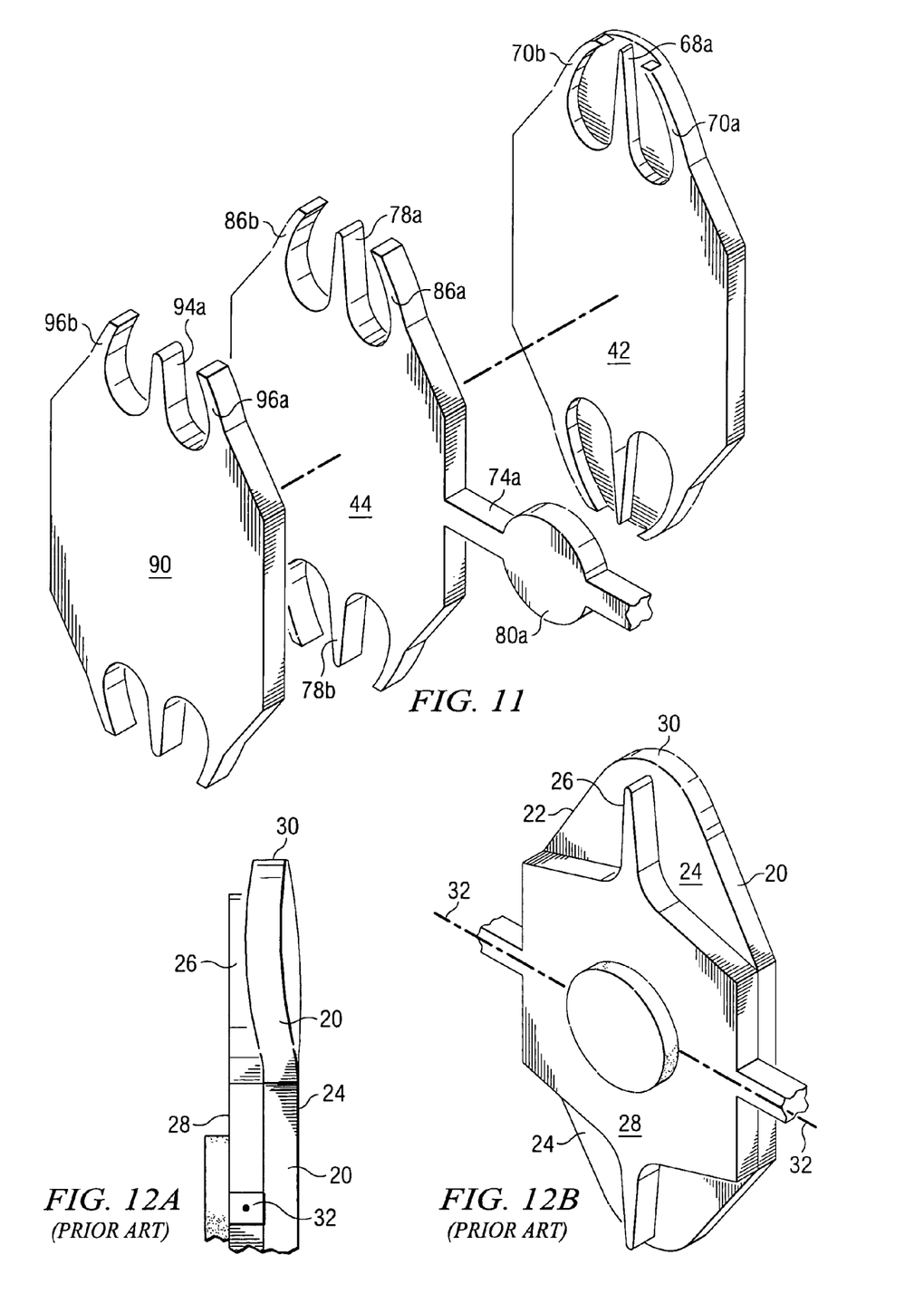
FIG. 11 is an exploded view of FIG. 10.
FIGS. 12A and 12B illustrate the flexing problem of prior art mirror structures solved by the present invention.

More specifically, referring to FIGS. 12A and 12B, there is illustrated how the edges 20 and 22 of the mirror layer 24 flex. Central spine 26 formed as part of the hinge plate 28 extends almost to the tip 30 of the elliptical shaped mirror and substantially reduces the flexing of the mirror as it rotates at high speeds about the rotational axis 32. Although perhaps exaggerated, it is seen that the edge 20 of the mirror portion 24 flexes in the area not reinforced by the central spine 26. This type of edge flexing has become unacceptable with higher mirror speeds.

Therefore, it would be advantageous to provide a torsional hinged mirror that has reduced flexing at the mirror edges.

SUMMARY OF THE INVENTION

These and other problems are generally solved or circumvented, and technical advantages are generally achieved, by preferred embodiments of the present invention, which provide a torsional hinged mirror assembly having reduced flexing at the mirror edges. The mirror assembly comprises a mirror member that includes a front layer that defines a reflective surface with a selected perimeter edge. A first dimension of the mirror extends along a first axis of the mirror between a first end and a second end. A second dimension that is orthogonal to the first dimension extends along a second axis.

A back layer is attached to the front layer and includes a center section and first and second end sections. Each of the first and second end sections define a central spine extending from the center section along the first axis and toward the first and second ends respectively. There is also included pair of perimeter ridges that extend from the center section of the back layer along the perimeter edge of the front layer toward the first and second ends respectively.

According to one embodiment of the invention, the front layer and back layer comprise a single unitary or integral piece of material, such as for example a silicon substrate. When formed from a unitary or single piece of silicon, for example, the central spine and perimeter ridges may be formed by using typical MEMS semiconductor manufacturing processes.

A hinge plate having a mirror side and a backside is bonded to the back layer of the mirror member and defines a perimeter edge similar to that of the mirror member. The hinge plate also includes a center section, which supports a pair of torsional hinges that extend away from the center section and along the second axis. Similar to the back layer of the mirror member, the hinge plate also includes a first and a second end section. Each of the end sections of the hinge layer define a central spine that extends away from the center section along the first axis. The center section and the central spine of the mirror member are aligned with the center section and central spine of the hinge plate. The aligned center sections and central spines are then typically bonded together to form a mirror assembly.

According to another embodiment of the invention, the first and second end sections of the hinge plate further comprise a pair of perimeter ridges that extend from the center section of the hinge plate along the outside or perimeter edge in a manner similar to the perimeter ridges on the back layer of the mirror member. The corresponding perimeter ridges of the hinge layer and mirror member are also preferably bonded together. A permanent magnet may be mounted to the backside of the hinge plate in either of the embodiments described above to provide pivotal motion to the mirror assembly or to act as part of a circuit to sense and monitor the mirrors motion.

According to still another embodiment of the invention, a torsional hinged mirror assembly similar to that discussed above may comprise a balancing plate rather than a permanent magnet. Similar to the hinge plate, the balancing plate comprises a center section, a first end section and a second end section. Each of the first and second end sections also define an outside or perimeter edge and a central spine. Similar to the central spine of the hinge plate already discussed, the central spine of the balancing plate extends from the center section of the balancing plate along the first axis and is bonded to the central spine of the hinge plate. The balancing plate may also comprise a pair of perimeter ridges that extend from the center section of the balancing plate along the perimeter or outside edge of the balancing plate. The perimeter ridges of the balancing plate may also be bonded to the perimeter ridges of the hinge plate.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
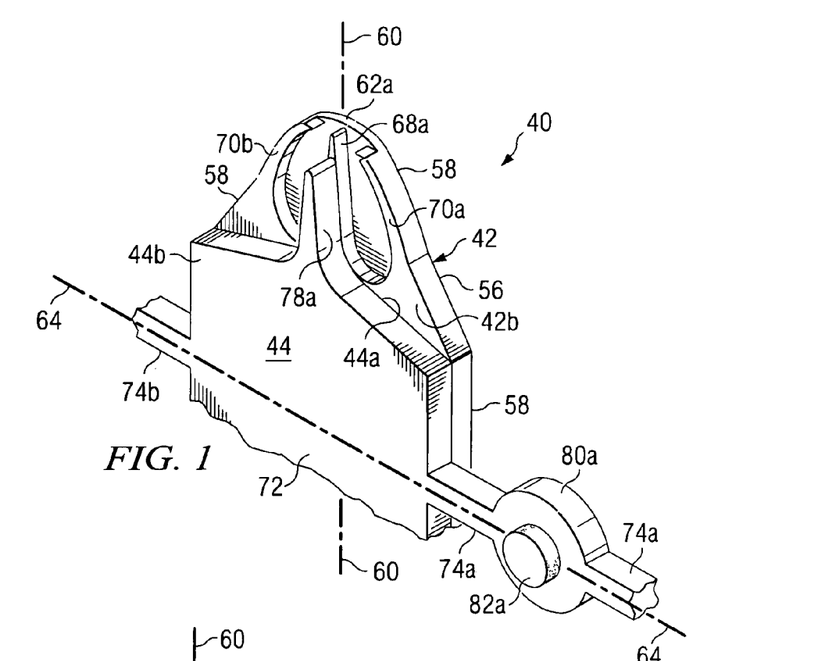
FIG. 1 illustrates a partial view of the torsional hinged mirror assembly according to an embodiment of the present invention.
Figure 2:
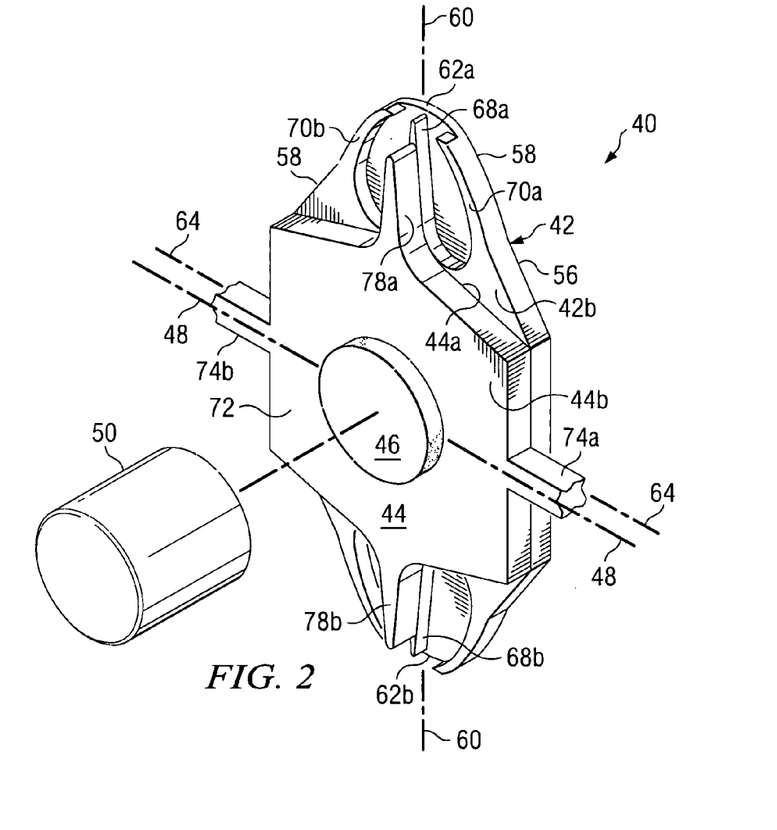
FIG. 2 illustrates another embodiment similar to FIG. 1 but further includes a permanent drive/sensing magnet and its corresponding coil.

Referring now to FIG. 1, there is shown a partial back view of a first embodiment of the mirror assembly 40 of the present invention. As shown there is a mirror member 42 attached or bonded to a hinge layer or plate 44. FIG. 2 is similar to FIG. 1, but also includes a permanent magnet 46 bonded to the back side 44b of hinge plate 44. As will be described in more detail later, permanent magnet 46 may be a drive magnet for imparting oscillating rotation about a pivoting axis 48 to the mirror assembly. In one embodiment the mirror assembly oscillates at its resonant frequency. Alternatively, permanent magnet 46 may be used as a monitor or sensing magnet to provide information concerning the pivotal motion of the mirror assembly 40.

Further, permanent magnet 46 is preferably selected to have a moment of inertia that is substantially equal to the moment of inertia of the mirror member 42 so that the center of the mass of the mirror assembly lies on pivoting axis 48. The embodiment of FIG. 2 also includes a magnetic coil 50 that interacts with permanent magnet 46 to provide the rotational torque to the mirror assembly 40, or alternately as discussed above, to provide information about the movement of the mirror assembly 40 due to changes in magnetic flux as the position of the permanent magnet changes.

Figure 3:
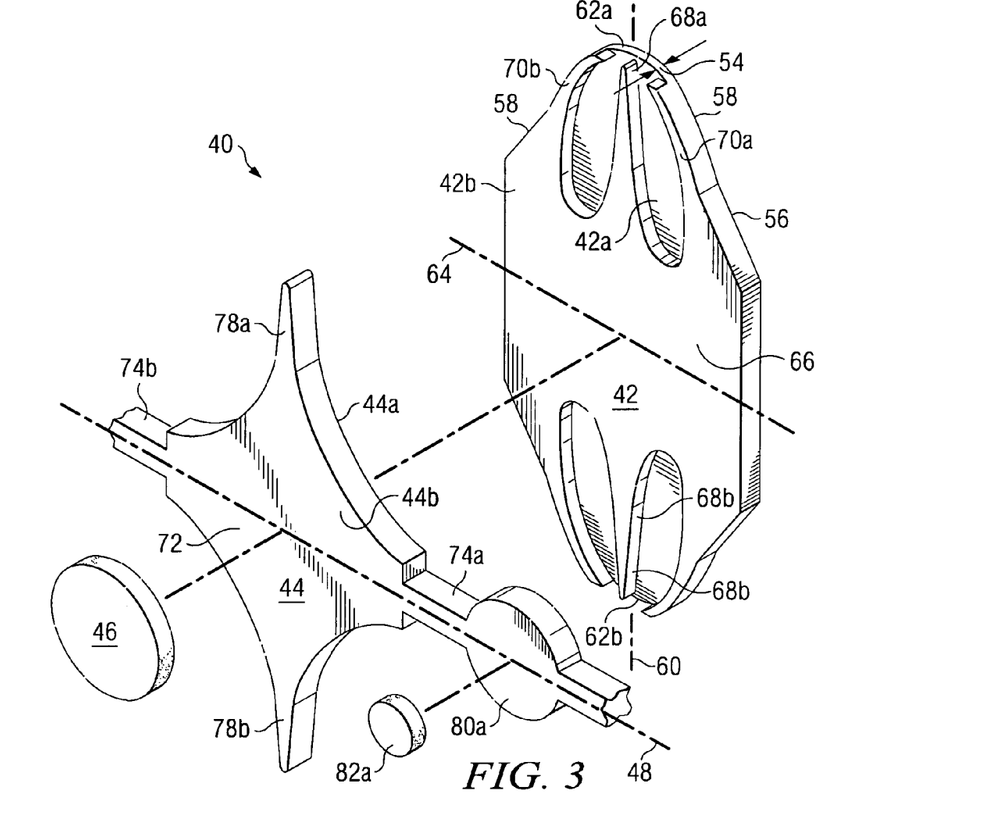
FIG. 3 is an exploded view similar to the mirror assemblies of FIGS. 1 and 2 and further illustrates the structure of the mirror member, the hinge plate, and the permanent magnet.

FIG. 3 is an exploded view of a mirror assembly similar to that illustrated in the embodiment of FIGS. 1 and 2 except the center section of the hinge plate 44 is reduced and more material has been removed from the back layer 42b of the mirror member 42 to reduce the weight.

Referring again to FIGS. 1 and 2 and especially FIG. 3, it is seen that the mirror member 42 includes a front layer 42a with a selected thickness as indicated by double arrows 54, and a back layer 42b that includes a central spine 68a and a pair of perimeter ridges 70a and 70b. According to one embodiment of the invention, the mirror member comprised of front layer 42a and the back layer 42b of the mirror member 42 is a single or unitary piece of silicon with the support spines 68a and perimeter ridges 70a and 70b of the back layer 42b etched into the silicon. According to the embodiment of FIGS. 1, 2, and 3, the front layer 42a of mirror member 42 defines a reflective front surface 56 and a perimeter edge 58. A first axis 60 of the mirror assembly 42 extends between a first end or tip 62a and a second end or tip 62b (shown in FIGS. 2 and 3). A second axis 64 extends orthogonally to the first axis. The second axis 64 is parallel to the pivoting axis 48. The back layer 42b of the mirror member 42 is formed to define a center section 66, and the central spines 68a (68b) extend from the center section 66 parallel to the first axis 60 toward the first and second ends or tips 62a and 62b. A pair of perimeter ridges 70a and 70b also extends from the center section 66 toward the first and second ends. However, the perimeter ridges 70a and 70b follow the perimeter edge 58 of the mirror member 42. As shown in FIGS. 2 and 3, hinge plate 44 has a mirror side 44a bonded to the back layer 42b of the mirror member 42. Hinge plate 44 includes a center section 72 and a pair of torsional hinges 74a and 74b that extend from center section 72 along a pivoting axis 48 that is parallel to the second axis mentioned above. The hinge plate also includes first and second end sections. Each of the first and second end sections define a central spine 78a (78b) that extends along the first axis 60. Also as shown in FIGS. 2 and 3 and as is discussed above, permanent magnet 46 may be bonded to a back side 44b of hinge plate 44 to provide rotational motion about the pivotal axis. Alternately, the permanent magnet 46 may be used to provide information about the movement of the mirror assembly. Referring again to FIGS. 1 and 3, there is shown another embodiment of the mirror having shown an enlarged area 80a that may be formed as part of torsional hinge 74a. A permanent magnet 82a may be bonded to the enlarged area 80a to provide pivotal rotation to the mirror assembly in a manner know by those skilled in the art. It should also be appreciated that a similar enlarged area and a second permanent magnet could be formed as part of torsional hinge 74b (not shown). Referring again to FIG. 3, it will be appreciated that the enlarged area 80a and permanent magnet 82a may be used to provide motion to the mirror assembly 40, while the permanent magnet 46 and sensing coil 50 provide feedback information concerning the pivotal movement of the mirror assembly. It should be appreciated, of course, that the invention covers embodiments with and without the enlarged areas 80 and permanent magnet 82. Further, other drive techniques may be used to provide rotational or pivotal motion to the mirror assembly. For example, as will be appreciated by those skilled in the art, a pair of piezoelectric units may be used to input resonant motion to the mirror assembly.

Figure 4:
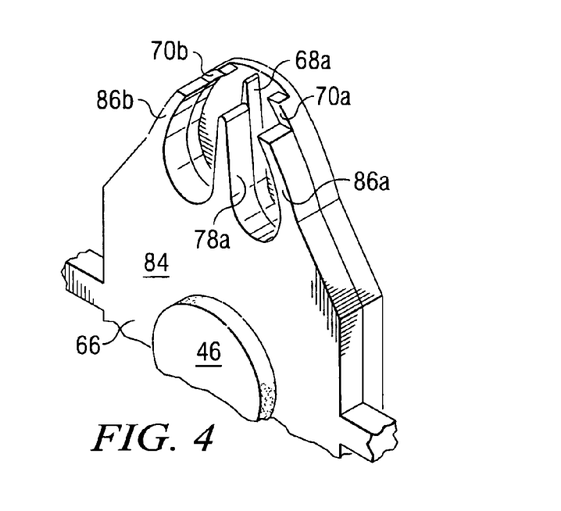
FIG. 4 illustrates another embodiment of the present invention.
Figure 4A:
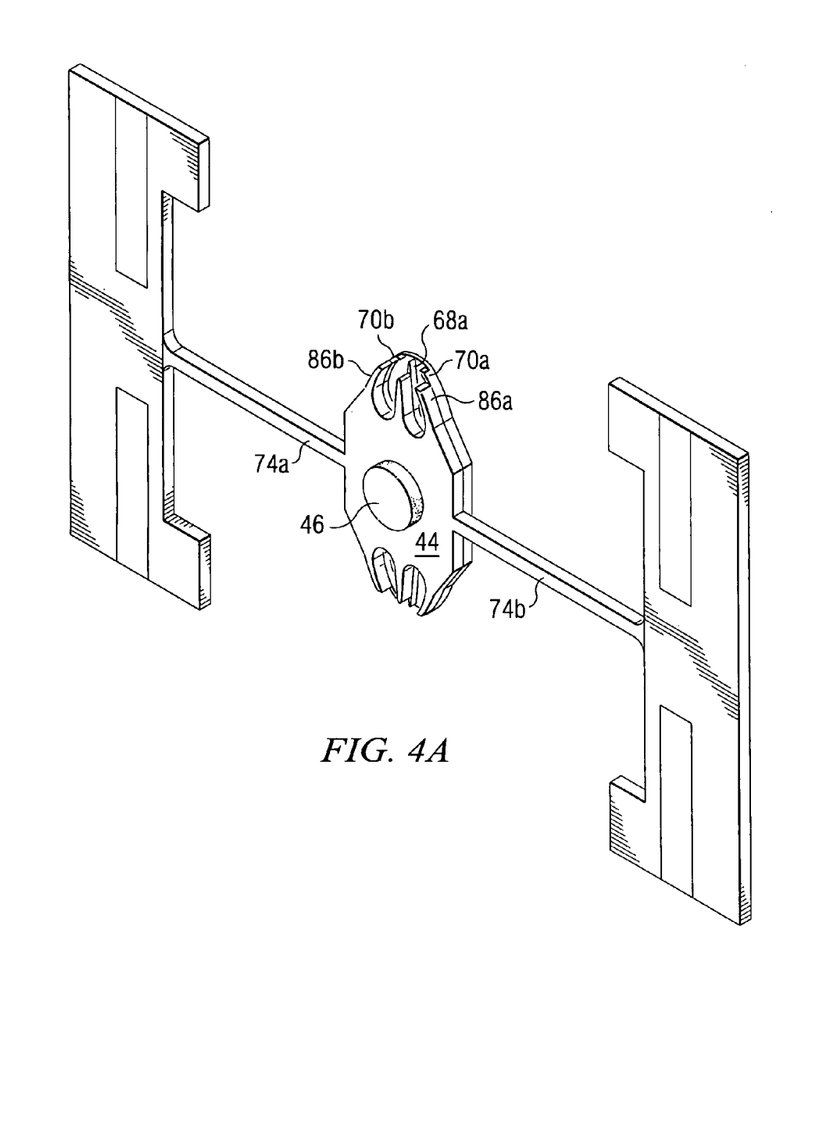
FIG. 4A is a complete perspective view of the mirror of FIG. 1 in proper proportion.
Figure 5:
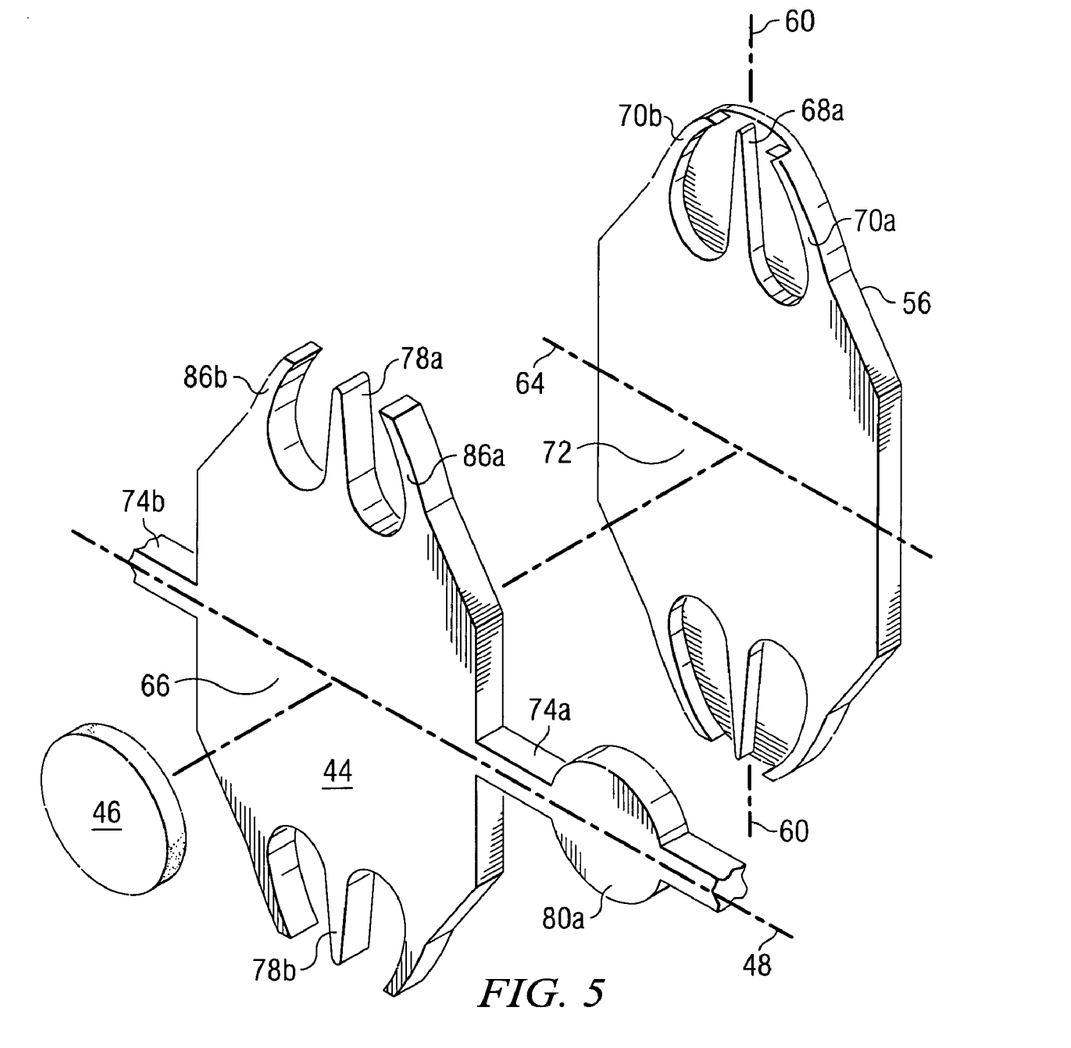
FIG. 5 is an exploded view of the mirror arrangement of FIG. 4

FIG. 4 illustrates another embodiment of the invention similar to that of FIGS. 1, 2, and 3, except the hinge plate 84 also includes perimeter ridges 86a and 86b that correspond to and are aligned with the perimeter ridges 70a and 70b of the mirror member 42. Thus, the aligned perimeter ridges provide greater support to the edges of the mirror member 42. FIG. 5 illustrates an exploded view of the embodiment of FIG. 4. It should also be appreciated that the figures illustrating the invention are not necessarily to scale, and may be intentionally distorted to emphasize and help explain details of the invention. A better visualization of the actual proportions of the mirror device of the invention is provided by FIG. 4A, which shows a full perspective view of the mirror assembly of FIG. 4.

Figure 6:
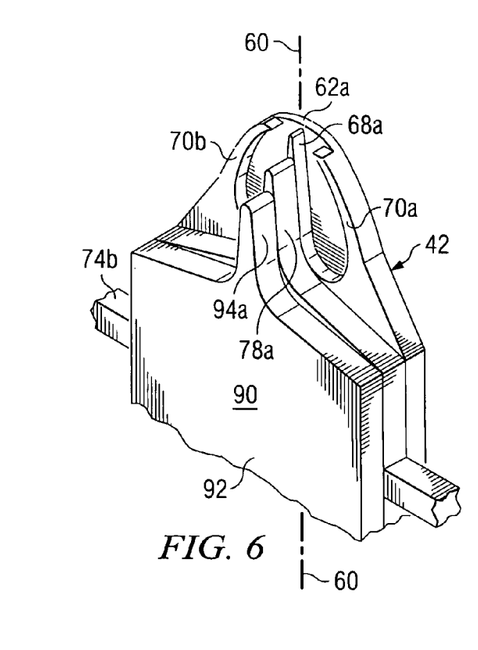
FIG. 6 illustrates an embodiment similar to that of FIG. 1 and further includes a balancing plate.

Referring now to FIG. 6, there is illustrated another embodiment of the invention. FIG. 6 is similar to the embodiment of FIGS. 1, 2, and 3, except that instead of a permanent magnet being bonded to the back side 44b of hinge plate 44 as discussed with respect to FIGS. 2 and 3, there is a balancing plate 90 bonded to the back side of hinge plate 44. Balancing plate 90 is selected to have a moment of inertia substantially equal to the moment of inertia of mirror member 42 and is provided to balance of the mirror member 42, so that the center of mass of the assembled mirror member 42, hinge plate 44, and balancing plate 90 lies on the pivoting axis 48 that extends along torsional hinges 74a and 74b. As shown, balancing plate 90 also includes a center section 92 and central spines 94a and 94b that extend from the center section 92 along the first axis 60.

Figure 7:
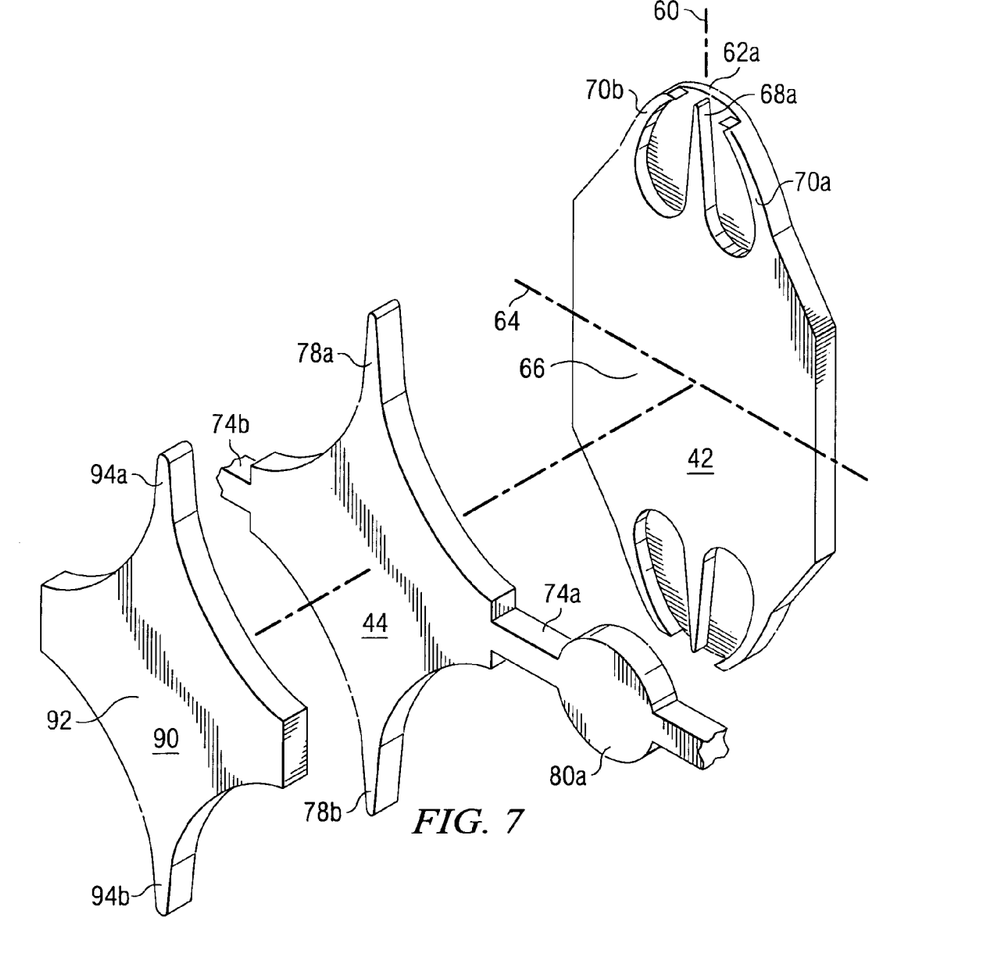
FIG. 7 is an exploded view of FIG. 6.

FIG. 7 is an exploded view of a mirror assembly similar to that of FIG. 6, except more material has been removed from the hinge plate 44 and the balancing plate 90.

Figure 8:
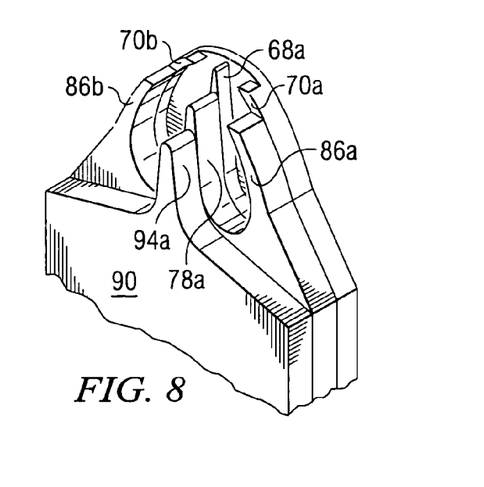
FIG. 8 is another embodiment of the invention and similar to FIG. 6 but includes a hinge plate with perimeter ridges.
Figure 9:
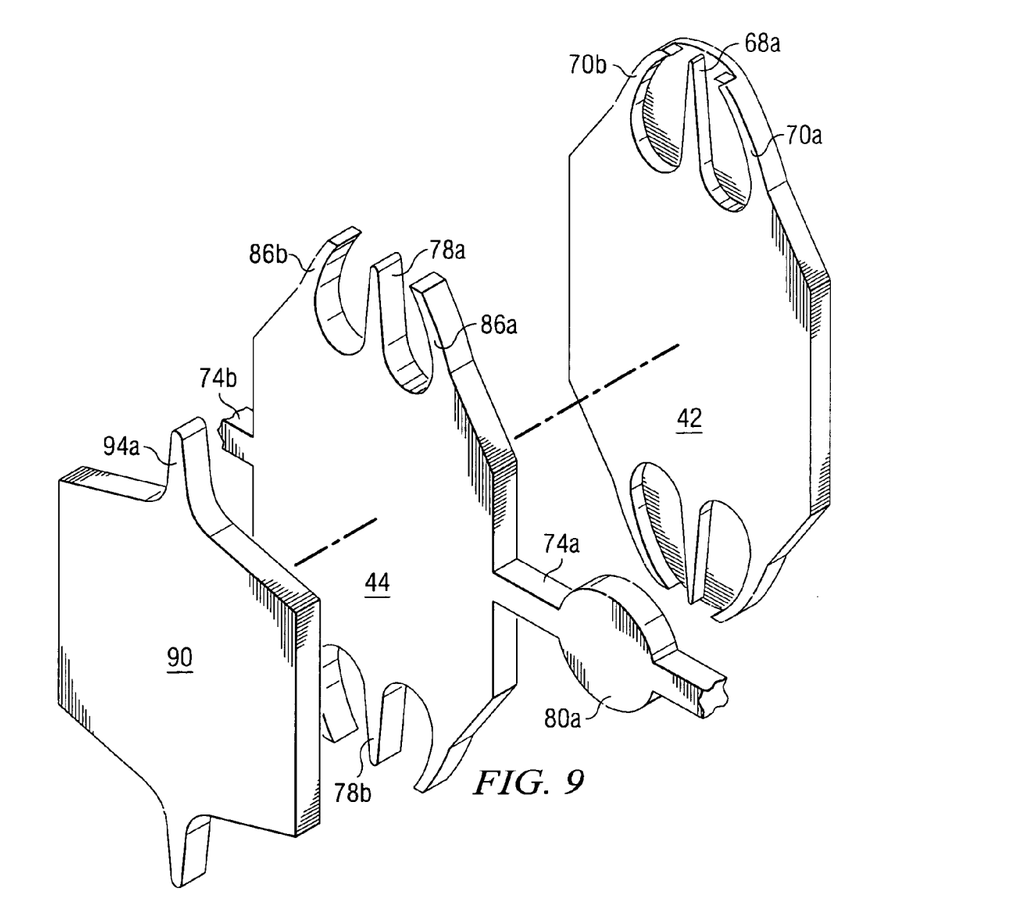
FIG. 9 is an exploded view of FIG. 8.

FIG. 8 is also similar to FIGS. 6 and 7 except that the hinge plate also includes the perimeter ridges 86a and 86b as was discussed with respect to FIGS. 4 and 5. In the embodiment of FIG. 8, the balancing plate 90 includes a central spine 94a and is the same as that shown in FIG. 6. FIG. 9 is an exploded view of the mirror assembly of FIG. 8.

Figure 10:
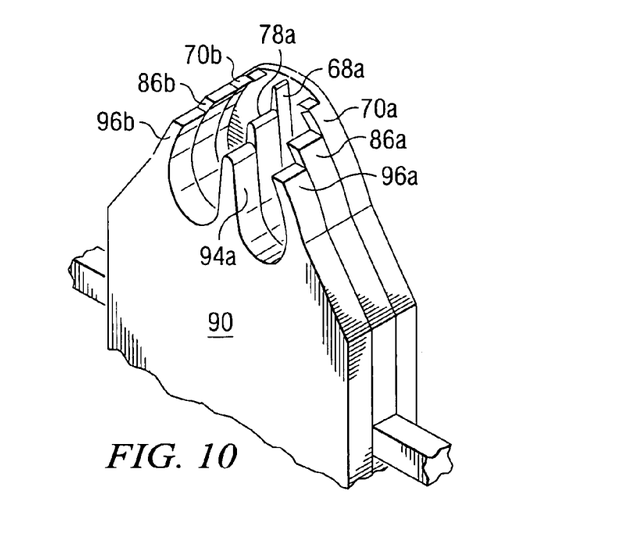
FIG. 10 is still another embodiment of the invention.

FIG. 10 is similar to the embodiment of FIG. 8, except the balancing plate 90 also includes perimeter ridges 96a and 96b. The perimeter ridges 96a and 96b of balancing plate 90 are also aligned with the perimeter ridges of the hinge plate 44 and mirror member 42 to provide still more support to the edges of the mirror reflective surface.

From the foregoing, it should be appreciated by those skilled in the art that the use of central spines and perimeter edges, as taught by the present invention, may be used advantageously to reduce flexing of an oscillating mirror at any speed depending on the thickness of the mirror layer. As examples only, testing has indicated that mirrors designed for operating speeds of 20 KHz and mirrors designed for operating speeds above 30 KHz, such as for example 32 KHz, will benefit from the teachings of the invention. Of course, if the mirror layer is made even thinner, the invention will be advantageous at much lower priority speeds.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the mirror assembly described in the specification. As one of ordinary skill in the art will readily appreciate from the disclosure of the present invention mirror assembly later to be developed, that perform substantially the same function or achieve substantially the same result as the corresponding embodiments described herein may be utilized according to the present invention. Accordingly, the appended claims are intended to include within their scope such mirror assembly.

What is claimed is:

1. A torsional hinged mirror assembly having a first axis and a second axis orthogonal to said first axis comprising:
   a mirror member comprising;
      a front layer defining a reflective surface with a perimeter edge, a first dimension extending along said first axis between first and second ends and a second dimension extending along said second axis;
      a back layer attached to said front layer including a center section and first and second end sections, each of said first and second end sections defining a central spine extending from said center section along said first axis toward said first and second ends respectively, and a pair of perimeter ridges extending from said center section proximate said perimeter edge of said front layer toward said first and second ends respectively;
   a hinge plate having a mirror side bonded to said back layer of said mirror member, and a backside comprising;
      a center section,
      a pair of torsional hinges extending away from said center section and along a pivotal axis, said pivotal axis parallel to said second axis, and
      first and second end sections defining a central spine extending away from said center section along said first axis; and
   said center section and said central spine of said mirror member aligned with the center section and central spine of said hinge plate.

2. The torsional hinged mirror assembly of claim 1 wherein said first and second end sections of said hinge plate further comprise a pair of perimeter ridges extending from said center section of said hinge plate, and wherein said pair of perimeter ridges of said hinge plate are aligned with said pair of perimeter ridges of said mirror member.

3. The torsional hinged mirror assembly of claim 1 and further comprising a permanent magnet mounted to the backside of said hinge plate.

4. The torsional hinged mirror assembly of claim 3 further comprising a magnetic coil that interacts with said permanent magnet.

5. The torsional hinged mirror assembly of claim 4 wherein said permanent magnet and said coil provide rotational energy to said mirror member.

6. The torsional hinged mirror assembly of claim 5 wherein said mirror assembly oscillates at its resonant frequency.

7. The torsional hinged mirror assembly of claim 4 wherein said permanent magnet and said coil operate as a sensing device.

8. The torsional hinged mirror assembly of claim 1 wherein at least one of said pair of torsional hinges further defines an enlarged area and further comprising a permanent magnet attached to said enlarged area for importing oscillating motion to said mirror assembly.

9. The torsional hinged mirror assembly of claim 1 further comprising a balancing plate.

10. The torsional hinged mirror assembly of claim 9 wherein said balancing plate comprises:
 a center section;
 first and second end sections, each of said first and second end sections defining a central spine extending from said center section of said balancing plate along said first axis; and
 said center section and said central spine of said balancing plate bonded to said center section and said central spine of said hinge plate.

11. The torsional hinged mirror assembly of claim 10 whereon said first and second end sections of said balancing plate further comprise a pair of perimeter ridges extending from said center section of said balancing plate, said pair of perimeter ridges of said balancing plate aligned with and bonded to said pair of perimeter ridges of said hinge plate.

12. The torsional hinged mirror assembly of claim 1 wherein said front layer and said back layer of said mirror member are formed from a unitary piece of material.

13. The torsional hinged mirror assembly of claim 1 wherein said mirror rotates at a speed above 20 KHz.

14. The torsional hinged mirror assembly of claim 13 wherein said mirror rotates at a speed of about 32 KHz.

15. The torsional hinged mirror assembly of claim 9 and further comprising a drive mechanism for importing oscillating motion to said mirror assembly.

16. The torsional hinged mirror assembly of claim 15 wherein said drive mechanism comprises a piezoelectric unit to impart said oscillating motion to said torsional hinged mirror assembly.

17. The torsional hinged mirror assembly of claim 9 wherein said mirror rotates at a speed above 20 KHz.

18. The torsional hinged mirror assembly of claim 17 wherein said mirror rotates at its resonant frequency.

\* \* \* \* \*